United States Patent
Hosseini et al.

(10) Patent No.: US 8,610,274 B2
(45) Date of Patent: Dec. 17, 2013

(54) DIE STRUCTURE, DIE ARRANGEMENT AND METHOD OF PROCESSING A DIE

(75) Inventors: Khalil Hosseini, Weihmichl (DE); Frank Kahlmann, Neubiberg (DE); Josef Hoeglauer, Kirchheim-Heimstetten (DE); Ralf Otremba, Kaufbeuren (DE); Georg Meyer-Berg, Munich (DE)

(73) Assignee: Infineon Technologies AG, Neubiberg (DE)

( * ) Notice: Subject to any disclaimer, the term of this patent is extended or adjusted under 35 U.S.C. 154(b) by 158 days.

(21) Appl. No.: 12/881,257

(22) Filed: Sep. 14, 2010

(65) Prior Publication Data

US 2012/0061835 A1    Mar. 15, 2012

(51) Int. Cl.
*H01L 23/48*        (2006.01)

(52) U.S. Cl.
USPC ........... 257/739; 257/762; 257/773; 257/784; 257/E23.024; 257/E21.011; 257/E21.012; 438/106

(58) Field of Classification Search
USPC .......... 257/739, 773, 775, E21.013, 780–784, 257/E23.129, E23.13, E23.131, E23.132, 257/734, 741, E21.011, E21.012
See application file for complete search history.

(56) References Cited

U.S. PATENT DOCUMENTS

| | | | |
|---|---|---|---|
| 5,869,357 A * | 2/1999 | Zambrano | 438/129 |
| 6,242,813 B1 * | 6/2001 | Huang et al. | 257/784 |
| 6,329,722 B1 * | 12/2001 | Shih et al. | 257/786 |
| 6,338,976 B1 * | 1/2002 | Huang et al. | 438/48 |
| 6,564,448 B1 * | 5/2003 | Oura et al. | 29/830 |
| 2001/0030363 A1 * | 10/2001 | Chopra et al. | 257/734 |
| 2004/0036137 A1 | 2/2004 | Gleason et al. | |
| 2007/0228567 A1 | 10/2007 | Bauer et al. | |
| 2009/0108474 A1 * | 4/2009 | Mizutani | 257/784 |
| 2010/0007009 A1 | 1/2010 | Chang et al. | |

FOREIGN PATENT DOCUMENTS

| | | |
|---|---|---|
| DE | 102004047522 B3 | 4/2006 |
| EP | 0286031 A2 | 10/1988 |
| EP | 1139413 A2 | 10/2001 |
| JP | 62209835 A | 9/1987 |
| JP | 645399 A | 2/1994 |
| JP | 10242622 A | 9/1998 |

OTHER PUBLICATIONS

English language abstract for JP 10-242622 A.
English language abstract for JP 62-209835 A.
English language abstract for JP 6-45399 A.

* cited by examiner

*Primary Examiner* — Jasmine Clark

(57) ABSTRACT

A die structure includes a die and a metallization layer disposed over the front side of the die. The metallization layer includes copper. At least a part of the metallization layer has a rough surface profile. The part with the rough surface profile includes a wire bonding region, to which a wire bonding structure is to be bonded.

28 Claims, 5 Drawing Sheets

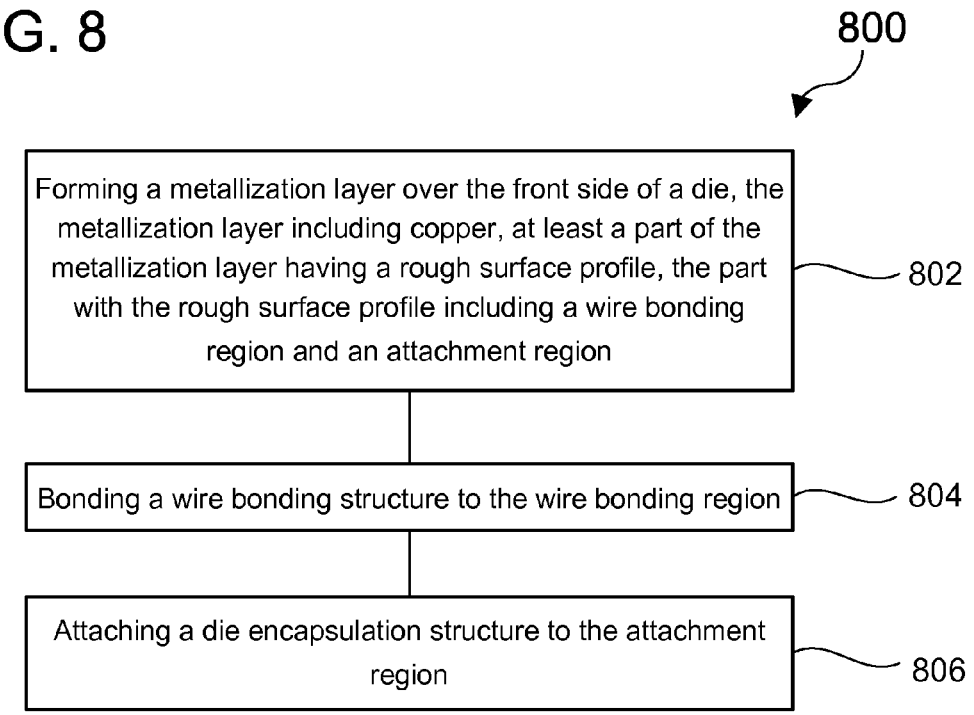
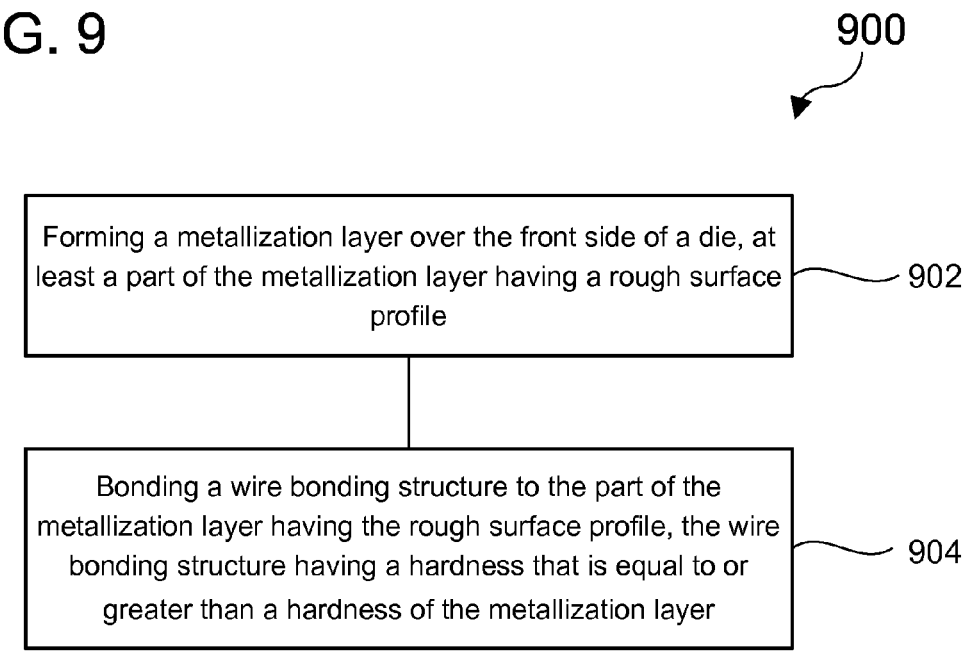

DIE STRUCTURE, DIE ARRANGEMENT AND METHOD OF PROCESSING A DIE

TECHNICAL FIELD

Embodiments generally relate to a die structure, a die arrangement and a method of processing a die.

BACKGROUND

Wire bonding processes are frequently used in the fabrication of integrated circuit dies in order to form interconnects between a die having integrated circuits and a pin of a device package. Furthermore, it becomes more and more desirable to use metal interconnects based on copper (Cu). However, it is technically difficult to use Cu wire bonding for logic products as, for example, the forces occurring throughout the bonding process may be so strong that underlying chip structures may be damaged.

For example, when using Cu wire bonding on thin Cu pad metallizations (having, for example, a thickness of about 5 µm) the occurring forces may lead to cracks in the metallization (metallization cracks) or damage of the active structures below the bond wire (e.g. cratering). Due to the greater hardness of Cu metallizations compared to aluminum (Al) metallizations high values of the bond parameters (e.g. ultrasound, force, time) are generally required for welding the wire material onto the Cu chip metallization. Due to the high values of the bond parameters the mechanical stress may be increased in the metallization under the bonding site and in the underlying active structures.

Thus, damages in the form of cracks may occur in the top metallization or in the metallization layer arrangement (Cu, TiN/Al) or damaging of devices (e.g. transistors) under the metallization may occur. This may lead to total failure of the semiconductor device or to failures after a long time of operation of the device.

Another issue with Cu wire bonding is that oftentimes only a small part of a Cu pad will be contacted by the Cu ball in a ball bonding process.

One approach to address the above-mentioned issues is to use Cu based interconnect structures that have thick pads or large pads in combination with large Cu wires. These structures may be relatively stable (e.g. with respect to crack formation) but also complex and/or costly. Furthermore, a structure with large pads and large wires may not be suited for logic products with fine pitches.

Other approaches to address the above-mentioned issues are tuning of the bond parameters or cleaning the Cu surface from oxidation.

BRIEF DESCRIPTION OF THE DRAWINGS

In the drawings, reference characters generally refer to the same parts throughout the different views. The drawings are not necessarily drawn to scale, emphasis instead is generally being placed upon illustrating the principles of embodiments. In the following description, various embodiments are described with reference to the following drawings, in which:

FIG. 8 is a diagram illustrating a method of processing a die in accordance with an embodiment of the present invention; and FIG. 9 is a diagram illustrating a method of processing a die in accordance with another embodiment of the present invention.

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
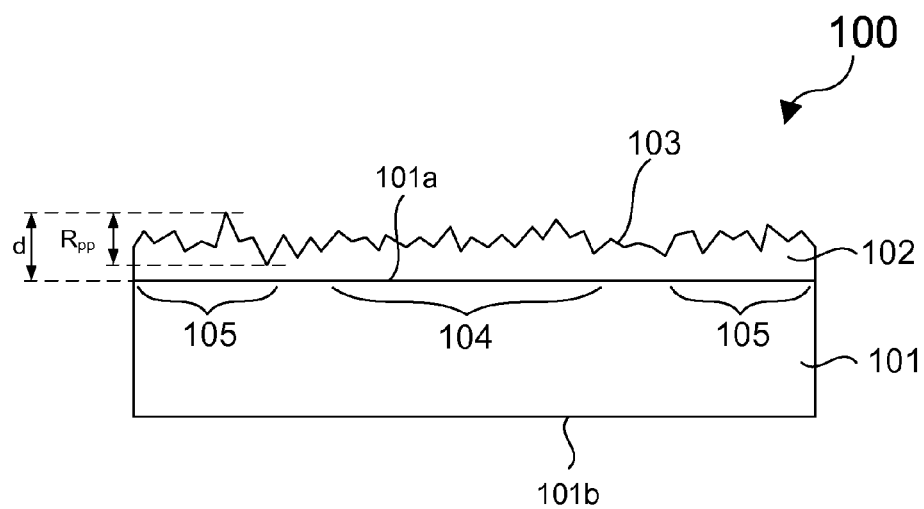
FIG. 1 shows a schematic cross-sectional view of a die structure in accordance with an embodiment of the present invention.

FIG. 1 shows a schematic cross-sectional view of a die structure 100 in accordance with an embodiment of the present invention.

The die structure 100 includes a die 101. The die 101 includes an upper side 101a. The upper side 101a of the die 101 may also be referred to as the front side of the die 101.

As used herein, the terms "upper side" or "front side" of a die may be understood to refer to that side of the die that the bonding wires are being attached to. The bonding wires may be attached to specific contact pads or, alternatively, may be attached to a larger part of the metalization that is covering most of the front side of the die.

The terms "upper side" and "front side" are used interchangeably hereinafter.

The die 101 may further include a bottom side 101b. The bottom side 101b of the die 101 may also be referred to as the back side 101b of the die 101.

As used herein, the terms "bottom side" or "back side" of a die may be understood to refer to that side of the die that is not being contacted via bonding wires.

The terms "lower side" and "back side" are used interchangeably hereinafter.

In accordance with one embodiment, the die 101 may be a semiconductor die. In other words, in this embodiment the die 101 may include or may be based on semiconducting material such as, for example, silicon (alternatively, other semiconducting materials may be used).

The die 101 may, for example, include a layer structure including one or more layers, e.g. one or more semiconducting layers (e.g. silicon layers, alternatively other semiconducting materials may be used) and/or one or more electrically conductive layers (e.g. metal layers) and/or one or more electrically insulating or dielectric layers (e.g. silicon oxide or silicon nitride layers, alternatively other electrically insulating or dielectric materials may be used) (not shown). Clearly, the die 101 may include one or more integrated circuits (IC) including, for example, a plurality of electric or electronic devices (such as, for example, transistors) and corresponding electrical wiring or metallization structures that may be formed by the layer structure of the die 101 (not shown). Alternatively, the die 101 may just comprise a power semiconductor switch, e.g. Power Metal Oxide Semiconductor Field-Effect Transistors (MOSFETs), Trench Power MOSFETs, Superjunction devices, Insulated-Gate Bipolar Transistors (IGBTs) or Diodes.

A metallization layer 102 is disposed over the front side 101a of the die 101. The metallization layer 102 may also be referred to as a front side metallization layer or front side metallization. The metallization layer 102 may be electrically connected to some or all of the IC and/or power semiconductor switching elements of the die 101 by means of the electrical wiring or metallization structures formed within the die 101 (not shown).

In accordance with one embodiment, the metallization layer 102 may include copper (Cu) or Cu alloys. In accordance with one embodiment, the metallization layer 102 may be made of copper. In accordance with another embodiment, the metallization layer 102 may be made of an alloy containing copper, for example Cu99.9%, Cu99.99%, Cu99.999%, or other Cu alloys like Cu 1-4% Ni, Cu 1-2% Ni 1-2% Si, Cu 1-4% Al; Cu 1-4% Si.

A thickness of the metallization layer 102 is denoted by the double arrow "d" in FIG. 1. In accordance with some embodiments, the metallization layer 102 may have a thickness in the range from about 1 µm to about 80 µm, for example in the range from about 1 µm to about 5 µm according to an embodiment, for example in the range from about 1.5 µm to about 2.5 µm according to an embodiment, for example a thickness of about 2 µm according to an embodiment. In accordance with another embodiment, the metallization layer 102 may have a thickness of about 5 µm. In accordance with other embodiments, the metallization layer 102 may have other values of the thickness.

In accordance with one embodiment, at least a part of the metallization layer 102 may have a rough surface profile 103.

In this context, the term "surface profile" as used herein, may be understood to refer to the profile of the upper surface of the metallization layer 102, i.e. that surface of the metallization layer 102 that faces a wire bonding structure (not shown in FIG. 1, see e.g. FIG. 3) to be bonded to the metallization layer 102 and/or a die encapsulation structure 302 (not shown in FIG. 1, see e.g. FIG. 3) to be attached to the metallization layer 102, in contrast to the lower surface of the metallization layer 102 that faces the die 101.

As used herein, the term "rough surface profile" or "rough surface" may be understood to refer to or include a macroscopically rough height profile of a layer, where "height" may clearly refer to the local thickness of that layer. Illustratively, a rough surface may refer to or may include a surface with a rugged interface having a plurality or multiplicity of peaks and valleys, as schematically illustrated in FIG. 1.

In this context, one option to characterize or measure the roughness of a surface (or of its height profile) is the so-called "peak-to-peak roughness ($R_{pp}$)". The peak-to-peak roughness (Rpp) of a surface (or of its height profile) may be understood to refer to the vertical difference between the highest point (highest peak) and the lowest point (lowest valley) on that surface. In other words, the peak-to-peak roughness may be given by $Rpp=\max_{(x,y)} h(x,y) - \min_{(x,y)} h(x,y)$, where (x, y) are the lateral coordinates of a surface point, h(x, y) is the surface height at (x, y), and $\max_{(x,y)} h(x,y)$ and $\min_{(x,y)} h(x,y)$ denote the maximum and minimum, respectively, of the surface height h(x,y) over all surface points (x, y).

In FIG. 1, the peak-to-peak roughness of the surface profile 103 of the metallization layer 102 is denoted by the double arrow "$R_{pp}$".

As used herein, the terms "rough surface" or "rough surface profile" may be understood to refer to or include a surface profile (of a layer) that has a peak-to-peak roughness ($R_{pp}$) value that is equal to or greater than a given threshold value, while the term "smooth surface" or "smooth surface profile" may be understood to refer to or include a surface profile (of a layer) that has a peak-to-peak roughness ($R_{pp}$) value that is less than the given threshold value.

For example, as used herein, a surface may be characterized as being "rough" when its peak-to-peak roughness $R_{pp}$ is equal to or greater than approximately 0.1 µm (100 nm), while a surface may be characterized as being "smooth" when its peak-to-peak roughness $R_{pp}$ is less than approximately 0.1 µm (100 nm).

In accordance with one embodiment, the rough surface profile 103 of the metallization layer 102 may have a peak-to-peak roughness $R_{pp}$ of at least 0.1 µm, for example a peak-to-peak roughness $R_{pp}$ in the range from about 0.1 µm to about the thickness "d" of the metallization layer 102 according to one embodiment, for example a peak-to-peak roughness $R_{pp}$ in the range from about 0.1 µm to about 5 µm according to another embodiment, for example a peak-to-peak roughness $R_{pp}$ in the range from about 0.1 µm to about 3 µm according to another embodiment, for example a peak-to-peak roughness $R_{pp}$ in the range from about 1 µm to about 3 µm according to another embodiment, for example a peak-to-peak roughness $R_{pp}$ in the range from about 1.5 µm to about 2.5 µm according to another embodiment, for example a peak-to-peak roughness of about 2 µm according to another embodiment. In accordance with other embodiments, the rough surface profile 103 of the metallization layer 102 may have a different value of the peak-to-peak roughness $R_{pp}$.

In accordance with one embodiment, the rough surface profile 103 of the metallization layer 102 may, for example, be obtained by depositing the metallization layer 102 and subsequently carrying out a chemical or physical (e.g. plasma) etch process on the deposited metallization layer 102.

In accordance with another embodiment, the rough surface profile 103 of the metallization layer 102 may, for example, be obtained by depositing at least one layer (e.g. at least one electrically conductive layer), patterning the at least one deposited layer (e.g. by means of a chemical or physical etch process) such that the at least one deposited layer has a rough surface profile, and conformally depositing the metallization layer 102 onto the at least one patterned layer with the rough surface profile such that the rough surface profile of the underlying patterned layer may clearly be transferred to the metallization layer 102. In other words, the metallization layer 102 may adopt the rough surface profile of the underlying layer.

In accordance with another embodiment, the rough surface profile 103 of the metallization layer 102 may, for example, be obtained by galvanic deposition of the metallization layer 102 with varying current density. Due to the variation of the current density during the deposition process, the metallization layer 102 with the rough surface profile 103 may develop.

In accordance with one embodiment, the part of the metallization layer 102 that has the rough surface profile 103 may include a wire bonding region 104, to which a wire bonding structure (not shown in FIG. 1, cf. FIG. 3) is to be bonded. In other words, a region of the metallization layer 102, to which one or more wire bonding structures (e.g. one or more bonding wires) will be bonded, may have the rough surface profile 103.

In accordance with another embodiment, the part of the metallization layer 102 that has the rough surface profile 103 may further include an attachment region 105, to which a die encapsulation structure (not shown in FIG. 1, cf. FIG. 3) is to be attached. In other words, a region of the metallization layer 102, to which a die encapsulation structure will be attached, may have the rough surface profile 103.

In accordance with another embodiment, the metallization layer 102 may be disposed over almost the entire front side 101a of the die 101, as shown in FIG. 1. In other words, the metallization layer 102 may almost completely cover the front side 101a of the die 101 in this embodiment. For example, in accordance with one embodiment, the metallization layer 102 may cover at least 50% of the front side 101a of the die 101, e.g. at least 70% in accordance with one embodiment, e.g. at least 80% in accordance with one embodiment, e.g. at least 90% in accordance with one embodiment.

In accordance with another embodiment, the metallization layer 102 may be disposed only over a part or parts of the front side 101a of the die 101. In other words, the metallization layer 102 may cover only a part or parts of the front side 101a of the die 101 in this embodiment.

In accordance with one embodiment, the metallization layer 102 may form or may include at least one electrode of the die 101, for example a source/drain electrode of the die 101 according to one embodiment, for example a source electrode of the die 101 according to one embodiment. In other words, the metallization layer 102 may serve as an electrode to make electrical contact between the electrical/electronic devices or integrated circuit elements of the die 101 and at least one electrical supply potential (for example, a source/drain potential according to an embodiment, e.g. a source potential according to an embodiment). To this end, one or more wire bonding structures (e.g. one or more bonding wires) may be bonded with their one end to the wire bonding region(s) 104 of the metallization layer 102 and may, for example, be bonded with their other end to one or more pins of a device package, in accordance with one embodiment.

In case that the metallization layer 102 almost completely covers the front side 101a of the die 101, almost the whole surface of the die 101 may clearly serve as an electrode (for example as a source/drain electrode, e.g. as a source electrode) of the die 101.

In accordance with another embodiment, the entire metallization layer 102 may have the rough surface profile 103, as shown in FIG. 1. In other words, the entire upper surface of the metallization layer 102 may be rough or roughened in this embodiment.

In accordance with an alternative embodiment, only a part or only parts of the metallization layer 102 may have the rough surface profile 103. In other words, in this embodiment, only a part or parts of the metallization layer 102 may have a rough surface profile 103 while another part or other parts of the metallization layer 102 may have a smooth surface profile. For example, according to an embodiment, a part (or parts) of the metallization layer 102 located between the wire bonding region 104 and the attachment region 105 may have a smooth surface profile. According to another embodiment, the part or parts of the metallization layer 102 that have a smooth surface profile may correspond to a part or parts of the metallization layer 102 that are free from a wire bonding structure and free from a die encapsulation structure.

In accordance with another embodiment, the attachment region 105 may include or may be an edge region of the metallization layer 102, as shown in FIG. 1.

As used herein, the term "edge region" may be understood to refer to or include a region that is located at an edge or periphery of the metallization layer 102.

In case that the metallization layer 102 covers the entire front side 101a of the die 101, the edge region of the metallization layer 102 may be located at an edge or periphery of the die 101, as shown in FIG. 1.

In accordance with another embodiment, a further metallization layer may be disposed over the bottom side 101b (back side) of the die 101 (not shown). The further metallization layer may also be referred to as the back side metallization layer or back side metallization. In accordance with another embodiment, the further metallization layer may form or may include at least one further electrode of the die 101, for example a further source/drain electrode of the die 101 according to one embodiment, for example a drain electrode of the die 101 in one embodiment. In other words, the further metallization layer may serve as a further electrode (for example, as a further source/drain electrode, e.g. as a drain electrode) to make electrical contact between electrical/electronic devices or integrated circuit elements of the die 101 and at least one further electrical supply potential (for example, a further source/drain potential according to one embodiment, e.g. a drain potential according to one embodiment). Clearly, in accordance with another embodiment, the further metallization layer may serve as a drain contact located at the back side 101b of the die 101.

In accordance with another embodiment, the die 101 may be bonded to a die paddle such that the die back side 101b (or a back side metallization layer disposed thereon) faces the die paddle (not shown). Bonding of the die 101 (or of the back side metallization layer, e.g. the drain contact) to the die paddle may for example be achieved using an adhesive material (e.g. glue) or by soldering. In an alternative embodiment, the die 101 may be bonded to a leadframe.

Figure 2:
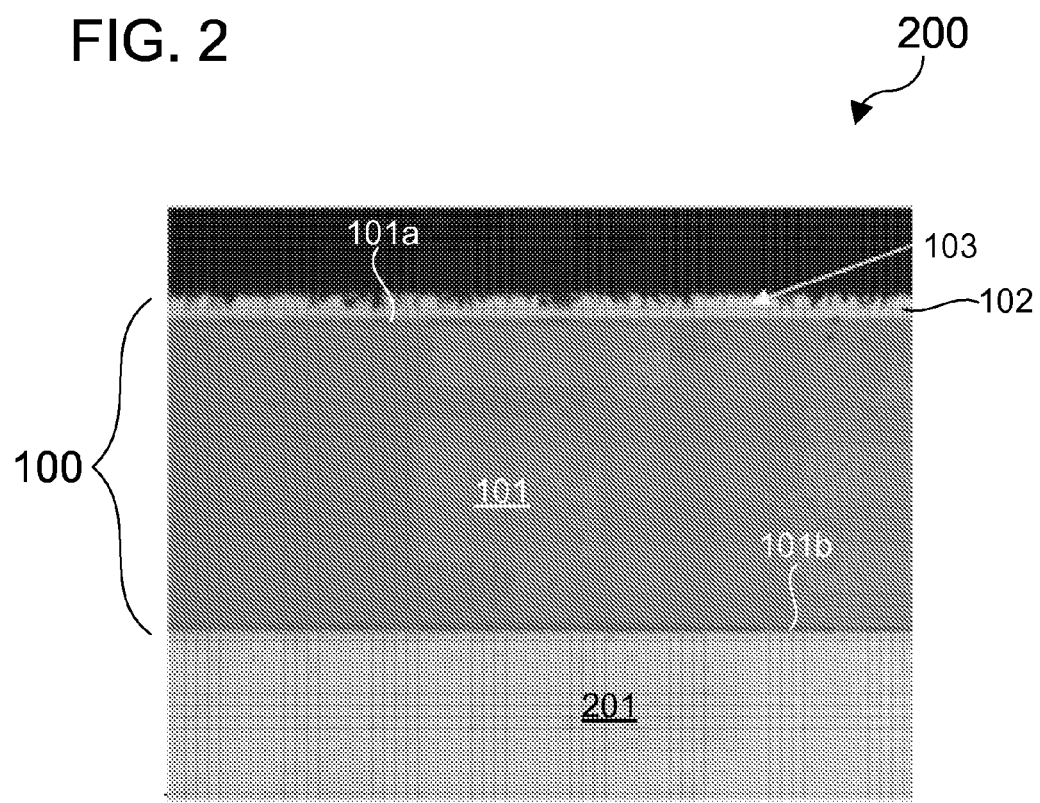
FIG. 2 shows a cross-sectional scanning electron microscopy image of a die structure in accordance with another embodiment of the present invention.

FIG. 2 shows a cross-sectional scanning electron microscopy image 200 of a die structure 100 disposed on a leadframe 201 in accordance with one embodiment.

The die structure 100 includes a die 101 and a Cu metallization layer 102 (Cu pad metallization) disposed over the front side 101a of the die 101. The die 101 is bonded with its back side 101b to the leadframe 201. The Cu metallization layer 102 has a rough surface profile 103. The peak-to-peak roughness of the surface profile 103, as measured, is approximately 2.14 μm. The Cu pad metallization 102 may be disposed over the entire front side 101a of the die 101.

Figure 3:
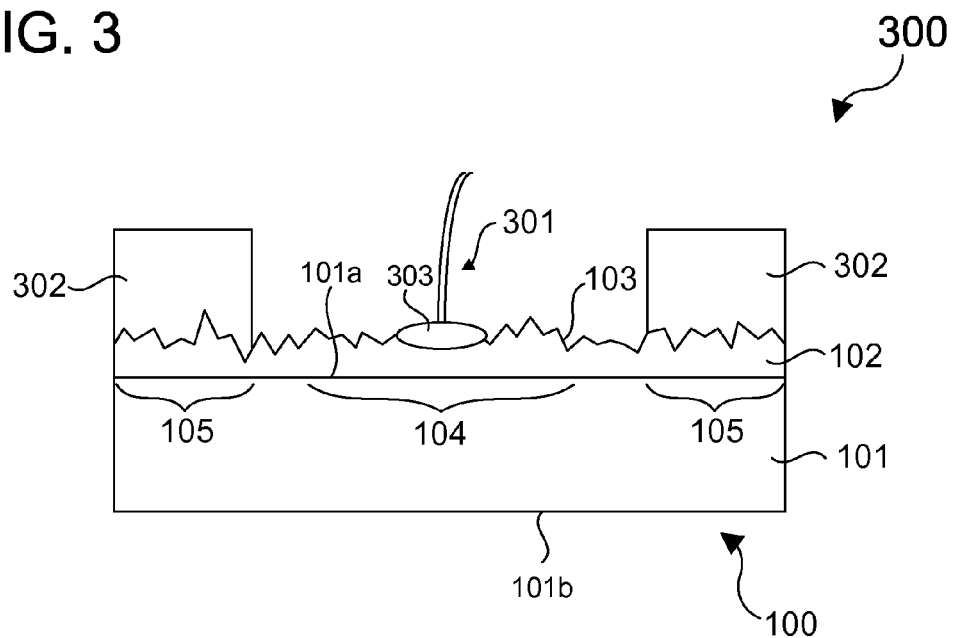
FIG. 3 shows a schematic cross-sectional view of a die arrangement in accordance with another embodiment of the present invention.

FIG. 3 shows a schematic cross-sectional view of a die arrangement 300 in accordance with another embodiment.

The die arrangement 300 includes a die structure 100. The die structure 100 includes a die 101 and a metallization layer 102 disposed over the front side 101a of the die 101. The die structure 100 may, for example, be configured in accordance with one or more embodiments described herein, for example, in accordance with one or more embodiments described in connection with FIG. 1.

The die arrangement 300 further includes a wire bonding structure 301 bonded to a wire bonding region 104 of the metallization layer 102 of the die structure 100. In other words, the wire bonding structure 301 or, to be more precise, the end portion 303 of the wire bonding structure 301 may be bonded to the rough surface of the metallization layer 102 in the wire bonding region 104.

In accordance with another embodiment, the die arrangement 300 may include more than one wire bonding structure 301, e.g. a plurality or multiplicity (in general, an arbitrary number) of wire bonding structures 301 that may be bonded to the wire bonding region 104.

In accordance with another embodiment, the wire bonding structure 301 may be configured as a bonding wire, as shown in FIG. 3. In accordance with other embodiments where more than one wire bonding structure 301, e.g. a plurality or a multiplicity of wire bonding structures 301, is present, some or all of the wire bonding structures 301 may be configured as a bonding wire.

In accordance with another embodiment, the wire bonding structure 301 (e.g. the bonding wire) or, to be more precise, the end portion 303 of the wire bonding structure 301 (e.g. the end portion of the bonding wire) may be in direct contact with the metallization layer 102. In other words, the end portion 303 of the wire bonding structure 301 (e.g. the bonding wire) and the metallization layer 102 (more precisely, the rough surface of the metallization layer 102 in the wire bonding region 104) may have a common interface.

Figure 4A:
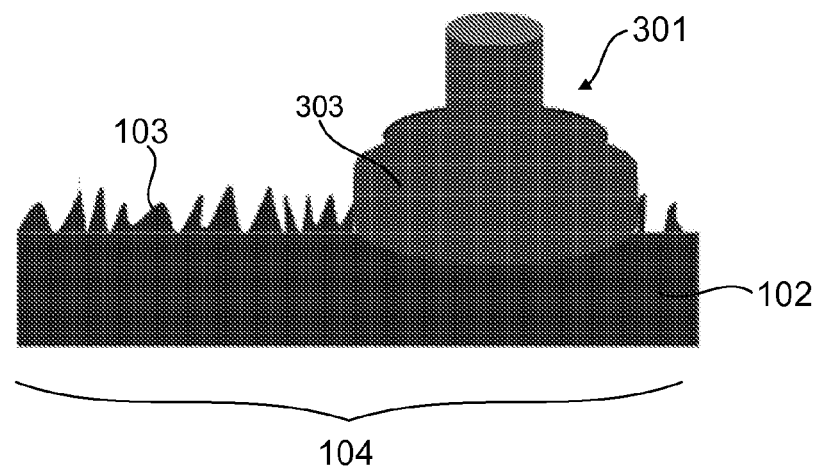
FIG. 4A illustrates a nailhead bond to a metallization layer in accordance with an embodiment of the present invention.

In accordance with one embodiment, the wire bonding structure 301 (e.g. the bonding wire) may be bonded to the wire bonding region 104 of the metallization layer 102 via a nailhead bond (e.g. using a nailhead/wedge wire bonding process (also referred to as ball/wedge wire bonding process) according to another embodiment). Clearly, in this embodiment an end portion 303 of the wire bonding structure 301 (e.g. of the bonding wire) that is in contact with the metallization layer 102 and forms the bond between the wire bonding structure (e.g. the bonding wire) and the metallization layer 102 may have the form of a nailhead, as is shown in FIG. 4A, which schematically illustrates a nailhead bond (e.g. a Cu nailhead bond in accordance with an embodiment) to the wire bonding region 104 of a rough pad metallization 102 (e.g. rough Cu pad metallization in accordance with one embodiment).

Figure 4B:
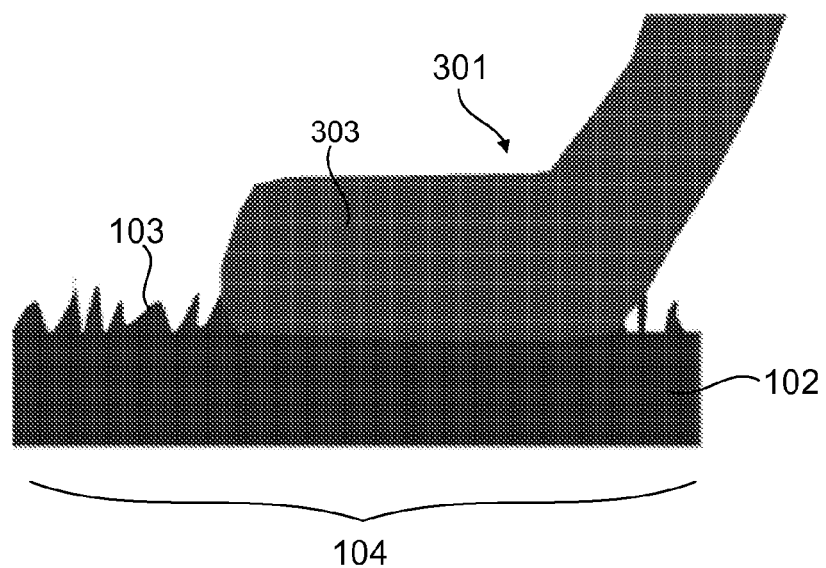
FIG. 4B illustrates a wedge bond to a metallization layer in accordance with another embodiment of the present invention.

In accordance with another embodiment, the wire bonding structure 301 (e.g. the bonding wire) of the die arrangement 300 shown in FIG. 3 may be bonded to the wire bonding region 104 of the metallization layer 102 via a wedge bond (e.g. using a wedge/wedge wire bonding process according to one embodiment). Clearly, in this case an end portion of the wire bonding structure 301 (e.g. of the bonding wire) that is in contact with the metallization layer 102 and forms the bond between the wire bonding structure (e.g. the bonding wire) and the metallization layer 102 may have the form of a wedge, as is shown in FIG. 4B, which schematically illustrates a wedge bond (e.g. a Cu wedge bond in accordance with an embodiment) to the wire bonding region 104 of a rough pad metallization 102 (e.g. rough Cu pad metallization in accordance with an embodiment).

In accordance with another embodiment, the wire bonding structure 301 may include copper (Cu). In accordance with another embodiment, the wire bonding structure 301 may be made of copper. In accordance with another embodiment, the wire bonding structure 301 may be made of an alloy containing copper, for example Cu99.0%, Cu99.9%, Cu99.99%, Cu—Ni alloy or Cu—Ni—Ag alloy.

In accordance with one embodiment, the wire bonding structure 301 or, to be more precise, the end portion 303 of the wire bonding structure 301 may have a hardness that is equal to or greater than a hardness of the metallization layer 102. In other words, the wire bonding structure 301 including the end portion 303 of the wire bonding structure 301 may include or may be made of a material (or materials) that is harder than the material or materials of the metallization layer 102. For example, in case that the metallization layer 102 is made of copper, the wire bonding structure 301 may also be made of copper (thus being of a material having the same hardness as the material of the metallization layer) or of a material (or materials, e.g. an alloy) that is (are) harder than copper. For example, the metallization layer could be made of copper Cu99.99% which is softer than copper wire made of Cu99.9%. Even when the metallization layer 102 as well as the bonding structure 301 (e.g. the bonding wire) are made of the same material, the end portion 303 of the bonding structure 301 (e.g. the end portion of the bonding wire) may have a greater hardness than the metallization layer which is due to the specific characteristic of the ball/wedge wire bonding process.

As used herein, the term "hardness" of a material may be understood as resistance of solid materials against any physical change of permanent shape by applying a force.

The die arrangement 300 further includes a die encapsulation structure 302 attached to an attachment region 105 of the metallization layer 102 of the die structure 100. In other words, the die encapsulation structure 302 may be formed on the rough surface of the metallization layer 102 in the attachment region 105.

In accordance with one embodiment, the die encapsulation structure 302 may be in direct contact with the metallization layer 102. In other words, the die encapsulation structure 302 and the metallization layer 102 (more precisely, the rough surface of the metallization layer 102 in the attachment region 105) may have a common interface.

In accordance with one embodiment, the die encapsulation structure 302 may serve to encapsulate the die structure 101 and may thus for example protect the die structure 101 against damage (e.g. damage due to mechanical force impacts).

In accordance with one embodiment, the die encapsulation structure 302 may include or may be made of a mold compound.

In accordance with one embodiment, the mold compound may include or may consist of at least one of the following materials: an epoxy material, a ceramic material, a plastic material. In accordance with another embodiment, the mold compound may include or may consist of other materials.

Figure 5:
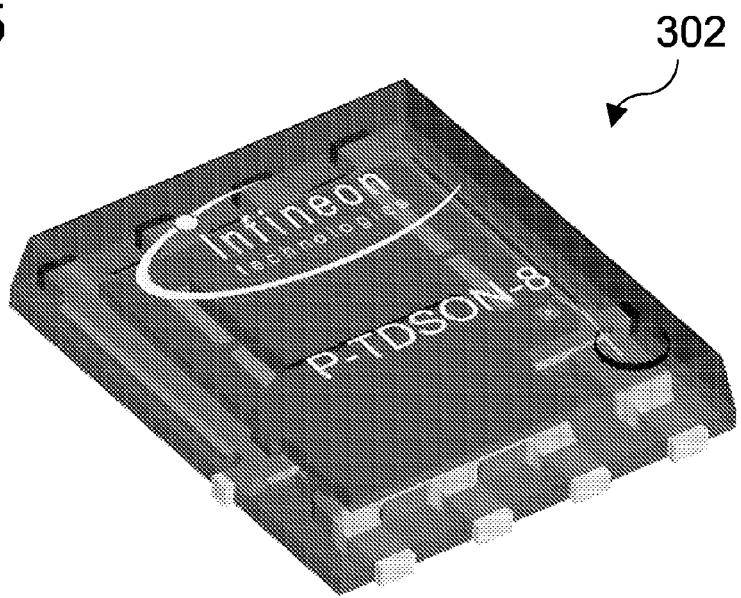
FIG. 5 shows a gate and/or source clip for use as die encapsulation structure in a die arrangement in accordance with another embodiment of the present invention.

In accordance with one embodiment, the die encapsulation structure 302 may be configured as a gate and/or source clip, as is shown in FIG. 5. The gate and/or source clip may, for example, be attached (in other words, connected) to the rough metallization layer 102 (e.g. rough Cu metallization in accordance with an embodiment) by means of soldering. Clearly, in accordance with one embodiment the rough metallization layer 102 (e.g. rough Cu metallization) may be configured as a solderable pad for contacting gate and/or source clips such as the one shown in FIG. 5.

Figure 6:
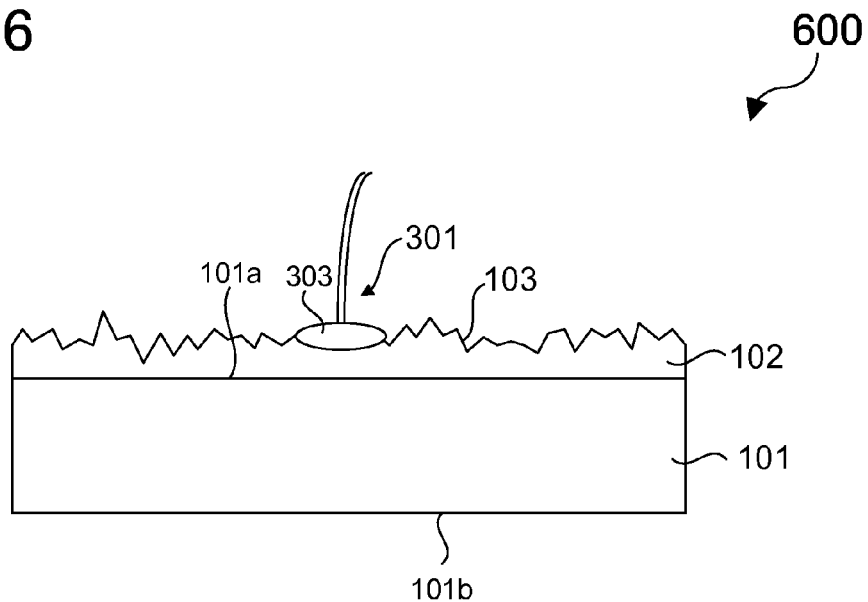
FIG. 6 shows a schematic cross-sectional view of a die arrangement in accordance with an embodiment of the present invention.

FIG. 6 shows a schematic cross-sectional view of a die arrangement 600 in accordance with one embodiment.

The die arrangement 600 includes a die 101. The die 101 may, for example, be configured in accordance with one or more embodiments described herein, for example in accordance with one or more embodiments described hereinabove in connection with FIG. 1.

A metallization layer 102 is disposed over the front side 101a of the die 101. At least a part of the metallization layer 102 has a rough surface profile 103. As shown in FIG. 6, the entire metallization layer 102 may have a rough surface profile 103 in accordance with one embodiment. In accordance with other embodiments, only a part or parts of the metallization layer 102 may have a rough surface profile 103 while another part or other parts of the metallization layer 102 may have a smooth surface profile 103.

In accordance with one embodiment, the metallization layer 102 may be configured as a front side metallization layer, for example as a copper front side metallization layer in accordance with one embodiment.

In accordance with another embodiment, the metallization layer 102 may be configured as a pad or as a plurality of pads, for example as a copper pad or as a plurality of copper pads in accordance with an embodiment.

The metallization layer 102 may, for example, further be configured in accordance with one or more embodiments described herein.

The die arrangement 600 further includes a wire bonding structure 301. The wire bonding structure 301 or, to be more precise, the end portion 303 of the wire bonding structure 301 is bonded to the part of the metallization layer 102 having the rough surface profile 103.

The wire bonding structure 301 or, to be more precise, the end portion 303 of the wire bonding structure 301 has a hardness that is equal to or greater than a hardness of the metallization layer 102. In other words, the wire bonding structure 301 may include or may be made of a material (or materials) that is harder than the material or materials of the metallization layer 102. For example, in case that the metallization layer 102 is made of copper, the wire bonding structure 301 may also be made of copper (thus being of a material having the same hardness as the material of the metallization layer) or of a material (or materials, e.g. an alloy) that is (are) harder than copper, for example copper material with a lower purity than the copper material of the metallization layer 102 (e.g. Cu99.9% in case that the metallization layer 102 is made of copper material with a purity higher than 99.9% such as, for example, Cu99.99%, Cu99.999% or copper material with even higher purity than 99.999%) or Cu—Ni alloy or Cu—Ni—Ag alloy. Once again, it should be noted that even when the metallization layer 102 as well as the bonding structure 301 (e.g. the bonding wire) are made of the same material, the end portion 303 of the bonding structure 301 (e.g. the end portion of the bonding wire) may have a greater hardness than the metallization layer 102 which is due to the specific characteristic of the ball/wedge wire bonding process.

In accordance with another embodiment, the metallization layer 102 may be made of pure copper with a high purity of 99.99% and the wire bonding structure 301 may be made of copper or copper alloy with a smaller purity than 99.99%.

The wire bonding structure 301 may, for example, further be configured in accordance with one or more embodiments described herein, for example in accordance with one or more embodiments described hereinabove in connection with FIGS. 3, 4A and 4B.

In accordance with one embodiment, a die encapsulation structure may be provided in the die arrangement 600 (not shown). The die encapsulation structure may be attached to the metallization layer 102 (for example, to an attachment region of the metallization layer 102 (e.g. an edge region of the metallization layer 102) in accordance with one embodiment) and may, for example, be configured in accordance with one or more embodiments described herein, for example in accordance with one or more embodiments described hereinabove in connection with FIG. 3.

Figure 7:
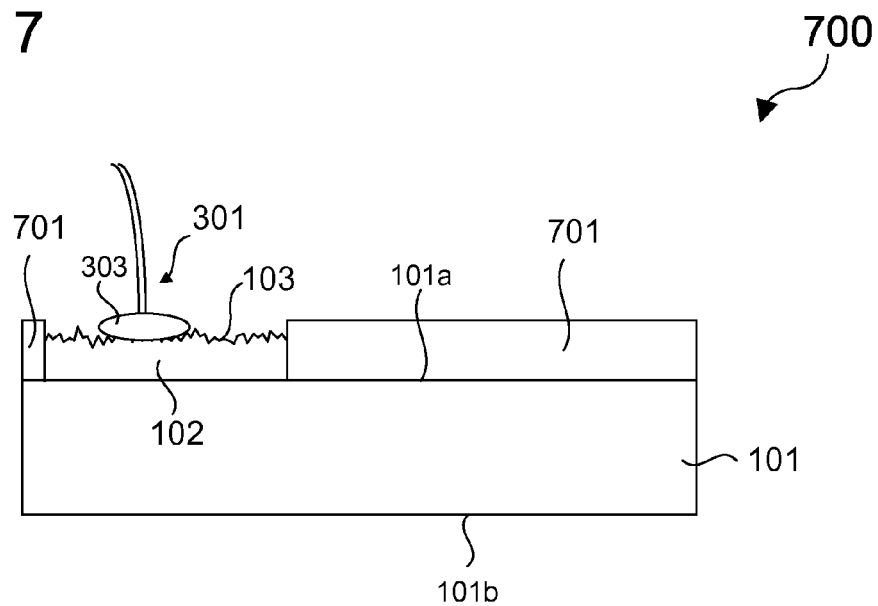
FIG. 7 shows a schematic cross-sectional view of a die arrangement in accordance with another embodiment of the present invention.

FIG. 7 shows a schematic cross-sectional view of a die arrangement 700 in accordance with another embodiment.

The die arrangement 700 includes a die 101. The die 101 may, for example, be configured in accordance with one or more embodiments described herein, for example in accordance with one or more embodiments described hereinabove in connection with FIG. 1.

The die arrangement 700 further includes a metallization layer 102 that is disposed over the front side 101a of the die 101. The metallization layer 102 is configured as a pad (in accordance with other embodiments, the metallization layer 102 may include or may be configured as a plurality or as a multiplicity of pads), for example as a bonding pad in accordance with one embodiment (or as a plurality or multiplicity of bonding pads in accordance with other embodiments). The pad 102 (or the plurality or multiplicity of pads), e.g. the bonding pad (or the plurality or multiplicity of bonding pads) includes copper (Cu). Furthermore, the pad 102 (or the plurality or multiplicity of pads), e.g. the bonding pad (or the plurality or multiplicity of bonding pads) has a rough surface profile 103.

The die arrangement 700 further includes a wire bonding structure 301 (in accordance with other embodiments, the die arrangement 700 may include a plurality or multiplicity of wire bonding structures 301). The wire bonding structure 301 includes copper (Cu) and is bonded or, to be more precise, the end portion 303 of the wire bonding structure 301 is bonded to the pad 102 (or to the plurality or multiplicity of pads), e.g. to the bonding pad (or to the plurality or multiplicity of bonding pads).

The wire bonding structure 301 may, for example, be configured in accordance with one or more embodiments described herein, for example in accordance with one or more embodiments described hereinabove in connection with FIGS. 3, 4A and 4B.

In accordance with one embodiment, the pad 102 (or the plurality or multiplicity of pads), e.g. the bonding pad (or the plurality or multiplicity of bonding pads), may be made of copper (Cu). In other words, the pad 102 (or the plurality or multiplicity of pads), e.g. the bonding pad (or the plurality or multiplicity of bonding pads) may be configured as a Cu pad (e.g. Cu bonding pad) in this embodiment. In accordance with another embodiment, the pad 102 (or the plurality or multiplicity of pads), e.g. the bonding pad (or the plurality or multiplicity of bonding pads), may be made of an alloy containing copper.

In accordance with another embodiment, a passivation layer (or layer stack) 701 may be formed adjacent to the pad 102 on the front side 101a of the die 101.

FIG. 8 shows a diagram that illustrates a method 800 of processing a die in accordance with one embodiment.

In 802, a metallization layer is formed over the front side of a die. The metallization layer includes copper. At least a part of the metallization layer has a rough surface profile. The part with the rough surface profile includes a wire bonding region and an attachment region. The metallization layer may, for example, further be configured in accordance with one or more embodiments described herein.

In 804, a wire bonding structure or, to be more precise, the end portion of a wire bonding structure is bonded to the wire bonding region. The wire bonding structure may, for example, be configured in accordance with one or more embodiments described herein.

In 806 a die encapsulation structure is attached to the attachment region. The die encapsulation structure may, for example, be configured in accordance with one or more embodiments described herein.

In accordance with one embodiment, the forming of the metallization layer in 802 may include forming (for example, depositing in accordance with an embodiment) at least one layer (for example, at least one electrically conductive layer in accordance with one embodiment, e.g. at least one metal layer in one embodiment), patterning the at least one layer (e.g. by means of an etching process) such that at least a part of the at least one layer has a rough surface profile, and conformally depositing a metal layer including copper (for example, a copper layer in accordance with an embodiment) on top of the at least one patterned layer.

In accordance with an alternative embodiment, the forming of the metallization layer in 802 may include depositing a metal layer including copper (for example, a copper layer in accordance with one embodiment) over the front side of the die and patterning the metal layer such that at least a part of the metal layer has a rough surface profile. In accordance with one embodiment, the patterning of the metal layer may include an etching process, for example a chemical etching process in accordance with one embodiment, or a physical etching process (e.g. plasma etching) in accordance with another embodiment.

FIG. 9 shows a diagram that illustrates a method 900 of processing a die in accordance with one embodiment.

In 902, a metallization layer is formed over the front side of a die. The die may, for example, be configured in accordance with one or more embodiments described herein. At least a part of the metallization layer has a rough surface profile. In accordance with one embodiment, the metallization layer may include copper. The metallization layer may, for example, further be configured in accordance with one or more embodiments described herein.

In 904, a wire bonding structure or, to be more precise, the end portion of a wire bonding structure is bonded to the part of the metallization layer having the rough surface profile. The wire bonding structure or, to be more precise, the end portion of the wire bonding structure has a hardness that is equal to or greater than a hardness of the metallization layer. In accordance with one embodiment, the wire bonding structure may include copper. The wire bonding structure may, for example, further be configured in accordance with one or more embodiments described herein.

A die structure in accordance with an embodiment of the present invention includes a die. The die structure further includes a metallization layer disposed over the front side of the die. The metallization layer includes copper. At least a part of the metallization layer has a rough surface profile. The part with the rough surface profile includes a wire bonding region, to which a wire bonding structure or, to be more precise, the end portion of a wire bonding structure is to be bonded.

In accordance with one embodiment, the metallization layer may have a thickness in the range from about 1 μm to about 80 μm.

In accordance with another embodiment, the metallization layer may almost completely cover the front side of the die.

In accordance with another embodiment, the entire metallization layer may have the rough surface profile.

In accordance with another embodiment, the rough surface profile may have a peak-to-peak roughness of at least 0.1 μm.

In accordance with another embodiment, the rough surface profile may have a peak-to-peak roughness in the range from about 1 μm to about 5 μm.

In accordance with another embodiment, the metallization layer may be made of copper.

A die arrangement in accordance with another embodiment of the present invention includes a die structure. The die structure may be configured in accordance with one or more embodiments described herein above. The die arrangement further includes a wire bonding structure bonded to the wire bonding region of the metallization layer of the die structure.

In accordance with one embodiment, the wire bonding structure may include copper.

A die arrangement in accordance with another embodiment of the present invention includes a die and a metallization layer disposed over the front side of the die. At least a part of the metallization layer has a rough surface profile. The die arrangement further includes a wire bonding structure or, to be more precise, the end portion of the wire bonding structure bonded to the part of the metallization layer having the rough surface profile. The wire bonding structure or, to be more precise, the end portion of the wire bonding structure has a hardness that is equal to or greater than a hardness of the metallization layer.

In accordance with one embodiment, the metallization layer may include copper.

In accordance with another embodiment, the wire bonding structure may include copper.

In accordance with another the metallization layer may have a thickness in the range from about 1 μm to about 80 μm.

In accordance with another embodiment, the rough surface profile may have a peak-to-peak roughness of at least 0.1 μm.

A die arrangement in accordance with another embodiment of the present invention includes a die. The die arrangement further includes a pad disposed over the front side of the die. The pad includes copper and has a rough surface profile. The die arrangement further includes a wire bonding structure. The wire bond includes copper and is bonded to the pad.

In accordance with one embodiment, the pad may have a thickness in the range from about 1 μm to about 80 μm.

In accordance with another embodiment, the rough surface profile of the pad may have a peak-to-peak roughness of at least 0.1 μm.

In accordance with another embodiment, the pad and the wire bonding structure may be made of copper.

A method of processing a die in accordance with another embodiment of the present invention includes: forming a metallization layer over the front side of a die, the metallization layer including copper, wherein at least a part of the metallization layer has a rough surface profile, the part with the rough surface profile including a wire bonding region; and bonding a wire bonding structure to the wire bonding region.

In accordance with one embodiment, the forming of the metallization layer may include forming at least one layer, patterning the at least one layer such that at least a part of the at least one layer has a rough surface profile, and conformally depositing a copper layer on the at least one patterned layer.

In accordance with another embodiment, the wire bonding structure may include copper.

A method of processing a die in accordance with another embodiment includes forming a metallization layer over the front side of a die, wherein at least a part of the metallization layer has a rough surface profile; and bonding a wire bonding structure or, to be more precise, the end portion of the wire bonding structure to the part of the metallization layer having the rough surface profile, wherein the wire bonding structure or, to be more precise, the end portion of the wire bonding structure has a hardness that is equal to or greater than a hardness of the metallization layer.

In accordance with one embodiment, the metallization layer may include copper.

In accordance with another embodiment, the wire bonding structure may include copper.

A die structure in accordance with another embodiment of the present invention includes: a die; and a metallization layer disposed over the front side of the die, the metallization layer including copper, wherein at least a part of the metallization layer has a rough surface profile, the part with the rough surface profile including a wire bonding region, to which a wire bonding structure is to be bonded and an attachment region, to which a die encapsulation structure is to be attached.

In accordance with one embodiment, the metallization layer may have a thickness in the range from about 1 μm to about 80 μm.

In accordance with another embodiment, the metallization layer may almost completely cover the front side of the die.

In accordance with another embodiment, the entire metallization layer may have the rough surface profile.

In accordance with another embodiment, the rough surface profile may have a peak-to-peak roughness of at least 0.1 μm.

In accordance with another embodiment, the rough surface profile may have a peak-to-peak roughness in the range from about 1 μm to about 5 μm.

In accordance with another embodiment, the metallization layer may be made of copper.

A die arrangement in accordance with another embodiment of the present invention includes a die structure in accordance with one or more embodiments described herein above; a wire bonding structure bonded to the wire bonding region of the metallization layer of the die structure; and a die encapsulation structure attached to the attachment region of the metallization layer of the die structure.

In accordance with one embodiment, the encapsulation structure may include a mold compound.

In accordance with another embodiment, the wire bonding structure may include copper.

In the following, certain features, aspects and effects of exemplary embodiments are described.

In accordance with some embodiments, a macroscopically rough surface is used for a Cu pad in a Cu wire bonding process. The rough pad metallization offers a macroscopic buffer layer, which has a larger contact area to mating parts than a smooth surface. Thus, when using ultrasonic wire bonding as the wire bonding process, friction between a bond wire and the pad may be increased at the bonding site. Thus, an improved or optimal contact between wire and pad may be achieved with lower values of the bond parameters (e.g. lower force, lower ultrasound energy, shorter time) compared to conventional methods, According to one embodiment, the macroscopically rough pad surface (e.g. Cu pad surface) may be formed or processed by means of an etching process, for example by means of a chemical etching process according to one embodiment, alternatively by means of a physical etching process such as, for example, a plasma etching process according to one embodiment. For example, according to one embodiment a pad layer (e.g. Cu pad layer) may be deposited and may subsequently be chemically (by chemical etching) or physically (by physical etching) roughened.

According to another embodiment, the macroscopically rough pad surface (e.g. Cu pad surface) may be formed by patterning one or more layers that lie below the pad layer (e.g. Cu pad layer) and subsequent conformal deposition of the pad layer (e.g. Cu pad layer) onto the patterned layer (or layers).

According to one embodiment, the processing of the rough pad surface may be performed as part of the front-end fabrication process after the wafer fabrication process.

According to an alternative embodiment, the processing of the rough pad surface may be performed as part of the back-end fabrication process prior to wire bonding (e.g. Cu wire bonding).

In accordance with one embodiment, wafer with Cu pads may be chemically roughened, either after formation of the Cu surface or by patterning the underlying layers and subsequent conformal Cu deposition.

One effect of the macroscopically rough pad metallization (e.g. rough Cu pad metallization) may be that adhesion of a mold compound on the rough surface may be increased.

According to some embodiments, a macroscopically rough pad metallization (e.g. Cu pad metallization) is combined with nailhead/wedge or wedge/wedge wire bonding (e.g. Cu nailhead/wedge or wedge/wedge wire bonding).

Another aspect may be the use of this macroscopically rough metallization (for example, rough Cu metallization) as a solderable pad for contacting gate and/or source clips.

In accordance with some embodiments, a metallization layer, for example a pad, e.g. a Cu pad, is roughened (in other words, the surface of the metallization layer (for example, of the pad, e.g. of the Cu pad) is made rough) such that in a wire bonding process the force transfer from the ball (e.g. Cu ball) to the metallization layer (for example, pad (e.g. Cu pad)) is converted more easily into deformation (e.g. Cu deformation). Thus, a better contact between the metallization layer (for example, pad, e.g. Cu pad) and the ball (e.g. Cu ball) may be achieved.

In accordance with some embodiments, by means of roughening a metallization layer (for example, a pad layer, e.g. a Cu pad layer) oxide layers (e.g. pad oxide layers) may be broken away during a wire bonding process such that a better contact may be achieved in the wire bonding process.

In accordance with some embodiments, a low-stress bonding or no-stress bonding of Cu bonding wires on Cu metallizations (e.g. Cu frontside metallizations or Cu pad metallizations) may be achieved. In other words, in accordance with some embodiments occurrence of significant mechanical stress within the metallization layer itself or within underlying active structures may be avoided.

In accordance with some embodiments, a surface of a frontside metallization layer (e.g. Cu frontside metallization) is roughened all over such that, in particular, a first region (also referred to as wire bonding region) of the frontside metallization layer, to which one or more bonding wires will be bonded, and a second region (also referred to as attachment region) of the frontside metallization layer, to which a die encapsulation structure (including e.g. a mold compound) will be attached, have a rough surface profile. By means of the first and second regions of the frontside metallization layer having the rough surface profile both the bonding of the bonding wire (or wires) to the first region and the attachment of the encapsulation structure to the second region may be improved.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A die structure, comprising:
   a die; and
   a metallization layer disposed over the front side of the die, the metallization layer comprising copper, wherein the entire metallization layer has a rough surface profile, the part with the rough surface profile including a wire bonding region, to which a wire bonding structure is to be bonded, wherein the rough surface profile has a peak-to-peak roughness of at least 0.1 μm.

2. The die structure as claimed in claim 1,
wherein the metallization layer has a thickness in the range from about 1 μm to about 80 μm.

3. The die structure as claimed in claim 1,
wherein the metallization layer almost completely covers the front side of the die.

4. The die structure as claimed in claim 1,
wherein the rough surface profile has a peak-to-peak roughness in the range from about 1 μm to about 5 μm.

5. A die arrangement, comprising:
a die structure as claimed in one of claims 1 to 3 and 4;
the wire bonding structure bonded to the wire bonding region of the metallization layer of the die structure.

6. The die arrangement as claimed in claim 5,
wherein the wire bonding structure comprises copper.

7. A die arrangement, comprising:
a die;
a metallization layer disposed over the front side of the die, wherein the entire metallization layer has a rough surface profile, wherein the rough surface profile has a peak-to-peak roughness of at least 0.1 μm; and
a wire bonding structure bonded to the part of the metallization layer having the rough surface profile, wherein the wire bonding structure has a hardness that is equal to or greater than a hardness of the metallization layer.

8. The die arrangement as claimed in claim 7,
wherein the metallization layer comprises copper.

9. The die arrangement as claimed in claim 8,
wherein the wire bonding structure comprises copper.

10. The die arrangement as claimed in claim 7,
wherein the metallization layer has a thickness in the range from about 1 μm to about 80 μm.

11. A die arrangement, comprising:
a die;
a pad disposed over the front side of the die, the pad comprising copper and the entire pad having a rough surface profile, wherein the rough surface profile has a peak-to-peak roughness of at least 0.1 μm; and
a wire bonding structure comprising copper and bonded to the pad.

12. The die arrangement as claimed in claim 11,
wherein the pad has a thickness in the range from about 1 μm to about 80 μm.

13. A method of processing a die, comprising:
forming a metallization layer over the front side of a die, the metallization layer comprising copper, wherein the entire metallization layer has a rough surface profile, the part with the rough surface profile including a wire bonding region, wherein the rough surface profile has a peak-to-peak roughness of at least 0.1 μm;
bonding a wire bonding structure to the wire bonding region.

14. The method as claimed in claim 13,
wherein the forming of the metallization layer comprises:
forming at least one layer;
patterning the at least one layer such that at least a part of the at least one layer has a rough surface profile; and
conformally depositing a copper layer on the at least one patterned layer.

15. The method as claimed in claim 14,
wherein the wire bonding structure comprises copper.

16. A method of processing a die, comprising:
forming a metallization layer over the front side of a die, wherein the entire metallization layer has a rough surface profile, wherein the rough surface profile has a peak-to-peak roughness of at least 0.1 μm; and
bonding a wire bonding structure to the part of the metallization layer having the rough surface profile, wherein the wire bonding structure has a hardness that is equal to or greater than a hardness of the metallization layer.

17. The method as claimed in claim 16,
wherein the metallization layer comprises copper.

18. The method as claimed in claim 17,
wherein the wire bonding structure comprises copper.

19. A die structure, comprising:
a die; and
a metallization layer disposed over the front side of the die, the metallization layer comprising copper, wherein the entire metallization layer has a rough surface profile, the part with the rough surface profile including a wire bonding region, to which a wire bonding structure is to be bonded and an attachment region, to which a die encapsulation structure is to be attached.

20. The die structure as claimed in claim 19,
wherein the metallization layer has a thickness in the range from about 1 μm to about 80 μm.

21. The die structure as claimed in claim 19,
wherein the metallization layer almost completely covers the front side of the die.

22. The die structure as claimed in claim 19,
wherein the rough surface profile has a peak-to-peak roughness of at least 0.1 μm.

23. The die structure as claimed in claim 22,
wherein the rough surface profile has a peak-to-peak roughness in the range from about 1 μm to about 5 μm.

24. A die arrangement, comprising:
a die structure as claimed in one of claims 19 to 21 and 22 to 23;
a wire bonding structure bonded to the wire bonding region of the metallization layer of the die structure; and
a die encapsulation structure attached to the attachment region of the metallization layer of the die structure.

25. The die arrangement as claimed in claim 24,
wherein the encapsulation structure comprises a mold compound.

26. The die arrangement as claimed in claim 24,
wherein the wire bonding structure comprises copper.

27. A method of processing a die, comprising:
forming a metallization layer over the front side of a die, the metallization layer comprising copper, wherein the entire metallization layer has a rough surface profile, the part with the rough surface profile including a wire bonding region;
bonding a wire bonding structure to the wire bonding region;
wherein the forming of the metallization layer comprises:
forming at least one layer;
patterning the at least one layer such that at least a part of the at least one layer has a rough surface profile; and
conformally depositing a copper layer on the at least one patterned layer.

28. The method as claimed in claim 27,
wherein the wire bonding structure comprises copper.

* * * * *